(12) United States Patent
Herrmann

(10) Patent No.: US 8,431,422 B2
(45) Date of Patent: Apr. 30, 2013

(54) METHOD FOR PRODUCING A MULTIPLICITY OF OPTOELECTRONIC COMPONENTS

(75) Inventor: Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 12/922,397

(22) PCT Filed: Jun. 18, 2009

(86) PCT No.: PCT/DE2009/000857
§ 371 (c)(1),
(2), (4) Date: Oct. 13, 2010

(87) PCT Pub. No.: WO2010/000224
PCT Pub. Date: Jan. 7, 2010

(65) Prior Publication Data
US 2011/0086447 A1    Apr. 14, 2011

(30) Foreign Application Priority Data
Jun. 30, 2008  (DE) .......................... 10 2008 030 815

(51) Int. Cl.
*H01L 25/0753* (2006.01)
*H01L 27/15* (2006.01)
*H01L 33/50* (2010.01)

(52) U.S. Cl.
USPC .............. 438/23; 438/29; 438/33; 438/35; 438/38

(58) Field of Classification Search .......... 438/27, 438/127, 107, 26; 257/98, 99, E21.499, E23.01, 257/E33.056
See application file for complete search history.

(56) References Cited

U.S. PATENT DOCUMENTS

| | | | | |
|---|---|---|---|---|
| 5,104,824 A | * | 4/1992 | Clausen et al. | 438/34 |
| 7,544,527 B2 | * | 6/2009 | Benner et al. | 438/29 |
| 2002/0055200 A1 | | 5/2002 | Kondo et al. | 438/106 |
| 2002/0093026 A1 | | 7/2002 | Huang | 257/98 |
| 2003/0129787 A1 | * | 7/2003 | Farnworth | 438/106 |
| 2004/0195576 A1 | | 10/2004 | Watanabe et al. | 257/79 |
| 2004/0232435 A1 | * | 11/2004 | Hofer et al. | 257/99 |

(Continued)

FOREIGN PATENT DOCUMENTS

| DE | 10128271 | 11/2002 |
|---|---|---|
| DE | 10245930 | 4/2004 |

(Continued)

OTHER PUBLICATIONS

Beth Keser et al.: "The Redistributed Chip Package: A Breakthrough for Advanced Packaging", Oct. 2006.

(Continued)

*Primary Examiner* — Olik Chaudhuri
*Assistant Examiner* — Wilner Jean Baptiste
(74) *Attorney, Agent, or Firm* — DLA Piper LLP (US)

(57) ABSTRACT

A method for producing a multiplicity of optoelectronic components includes providing a semiconductor body carrier including on a first main area a multiplicity of semiconductor bodies, each provided with a contact structure and having an active layer that generates electromagnetic radiation, in a semiconductor layer sequence, and forming a planar filling structure on the first main area such that the planar filling structure at least partly covers regions of the contact structure and the semiconductor body carrier without covering the semiconductor body.

15 Claims, 7 Drawing Sheets

U.S. PATENT DOCUMENTS

| | | | |
|---|---|---|---|
| 2005/0151246 A1* | 7/2005 | Daeche et al. | 257/723 |
| 2005/0233503 A1* | 10/2005 | Leib et al. | 438/127 |
| 2007/0126016 A1 | 6/2007 | Chen et al. | 257/96 |
| 2008/0079015 A1* | 4/2008 | Krummacher | 257/98 |
| 2009/0217516 A1* | 9/2009 | Pawlowski et al. | 29/832 |
| 2010/0038673 A1* | 2/2010 | Wirth | 257/99 |
| 2010/0096640 A1* | 4/2010 | Kim et al. | 257/82 |
| 2010/0171215 A1* | 7/2010 | Fischer et al. | 257/734 |

FOREIGN PATENT DOCUMENTS

| | | |
|---|---|---|
| DE | 102007004303 | 2/2008 |
| DE | 102007030129 | 1/2009 |
| DE | 102007043877 | 1/2009 |
| DE | 102008013030 | 6/2009 |
| DE | 102008014094 | 9/2009 |
| EP | 1592074 | 4/2005 |
| WO | 2005/099310 | 10/2005 |

OTHER PUBLICATIONS

M. Brunner et al.: "An Embedded Device Technology Based on a Molded Reconfigured Wafer", Jun. 2006.

\* cited by examiner

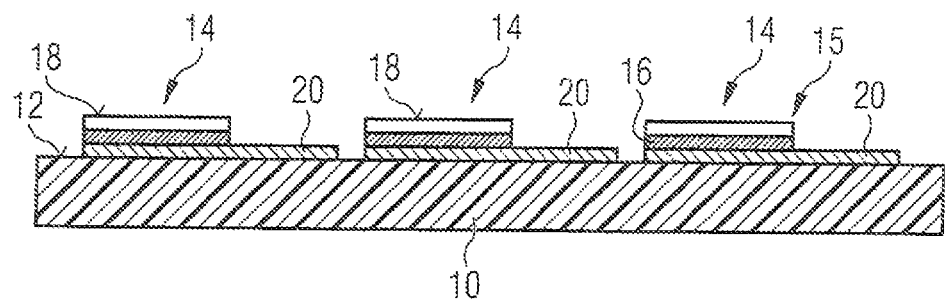
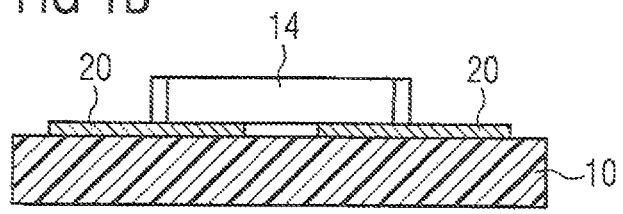
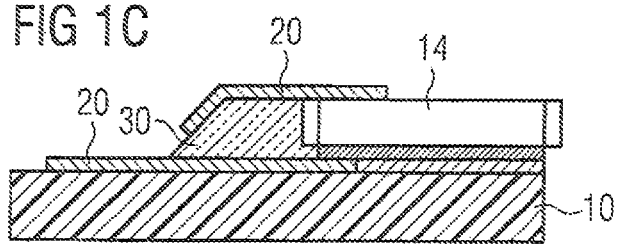
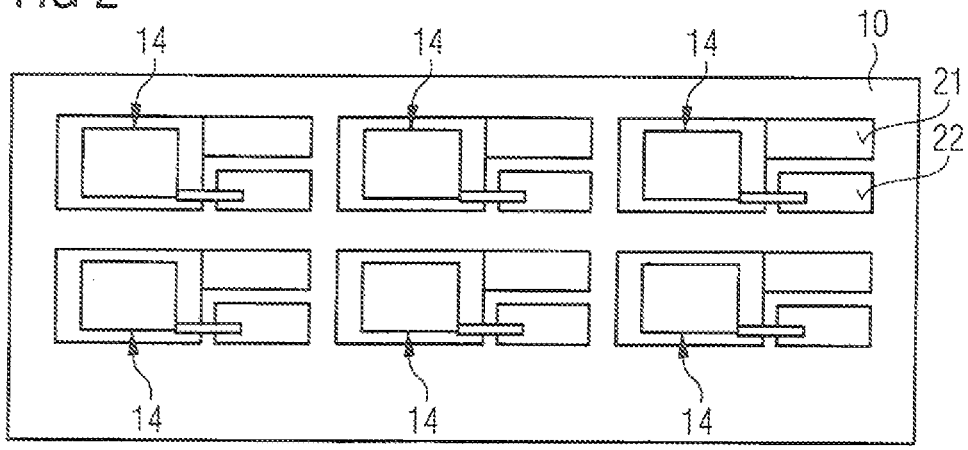

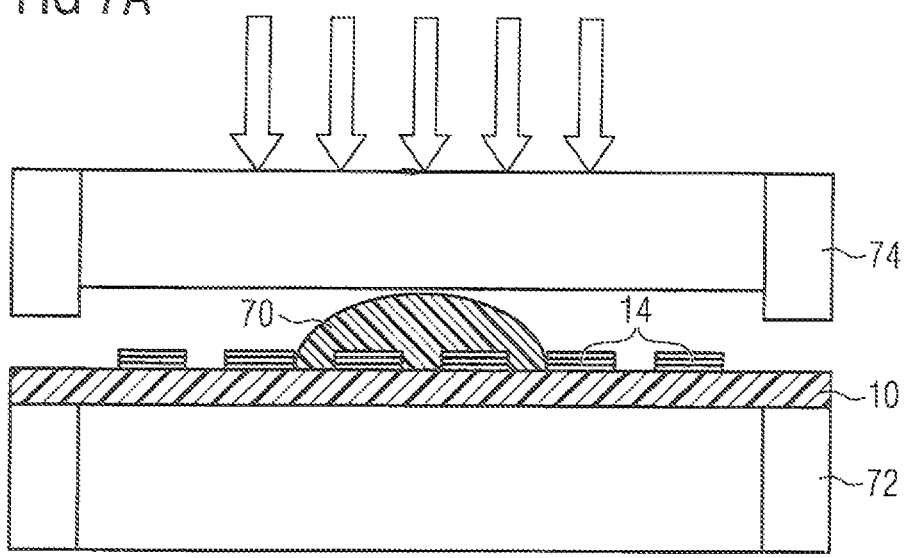
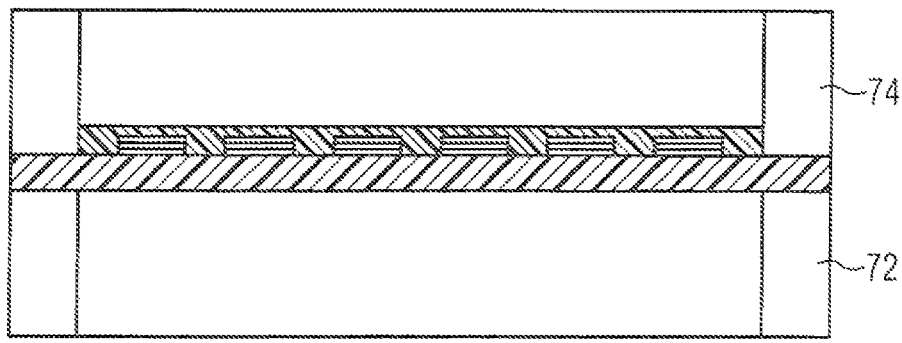

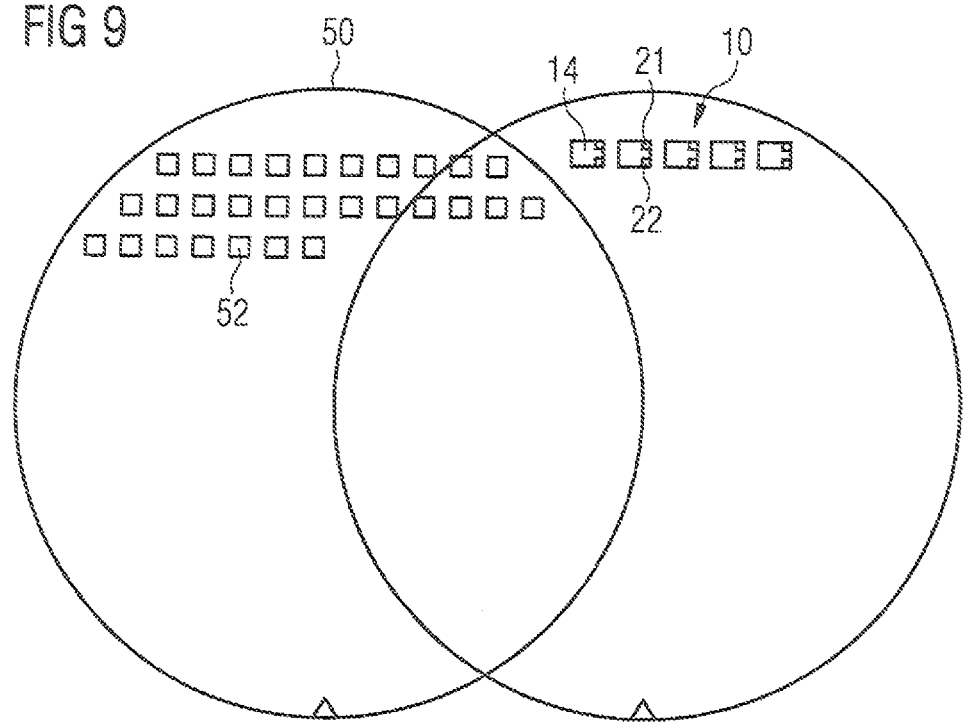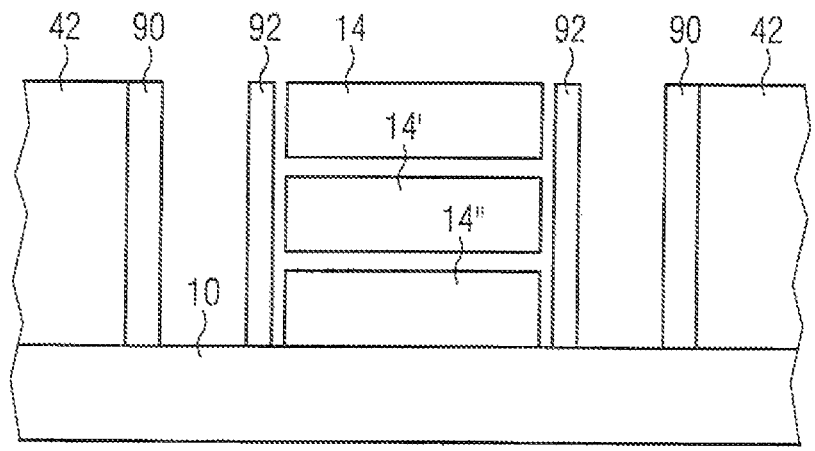

METHOD FOR PRODUCING A MULTIPLICITY OF OPTOELECTRONIC COMPONENTS

RELATED APPLICATIONS

This is a §371 of International Application No. PCT/DE2009/000857, with an international filing date of Jun. 18, 2009 (WO 2010/000224 A2, published Jan. 7, 2010), which is based on German Patent Application No. 10 2008 030 815.3, filed Jun. 30, 2008, the subject matter of which is incorporated by reference.

TECHNICAL FIELD

This disclosure relates to a method for producing a multiplicity of optoelectronic components.

BACKGROUND

The production of optoelectronic components which, after production, are intended to be fixed and contact-connected on a connection carrier often necessitates a series of individual processing steps that have to be carried out individually in particular for producing each component.

However, individual processing steps, that is to say steps which are carried out separately for each component, are cost-intensive and complex in comparison with processing steps which can be carried out simultaneously for a multiplicity of components.

It could therefore be helpful to provide a method for producing a multiplicity of optoelectronic components which can be produced in a simplified manner.

SUMMARY

I provide a method for producing a multiplicity of optoelectronic components including providing a semiconductor body carrier including on a first main area a multiplicity of semiconductor bodies, each provided with a contact structure and having an active layer that generates electromagnetic radiation, in a semiconductor layer sequence, and forming a planar filling structure on the first main area such that the planar filling structure at least partly covers regions of the contact structure and the semiconductor body carrier without covering the semiconductor body.

BRIEF DESCRIPTION OF THE DRAWINGS

FIGS. 1A to 1C in each case show examples of an optoelectronic component in a schematic cross-sectional view.

FIG. 2 shows a further example of a multiplicity of optoelectronic components in a plan view.

FIGS. 7A and 7B show a further example for producing a multiplicity of optoelectronic components in each case in a schematic cross-sectional view.

FIG. 9 shows an illustration of an example of a multiplicity of optoelectronic components.

FIG. 10 shows a further example for producing a multiplicity of optoelectronic components, in a schematic cross-sectional view.

DETAILED DESCRIPTION

Figure 3A:
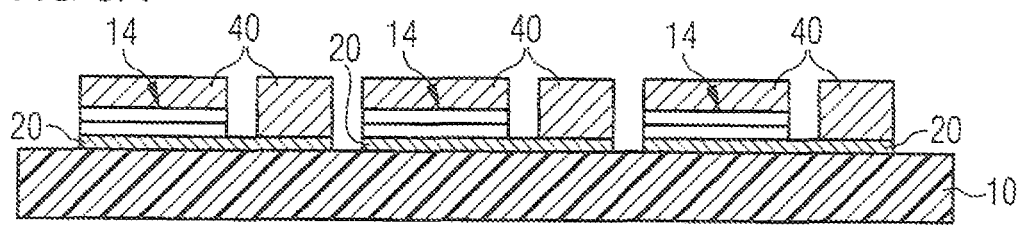
FIGS. 3A to 3E show further examples for producing a multiplicity of optoelectronic components in a schematic cross-sectional view.

I provide a method for producing a multiplicity of optoelectronic components, the method comprising the following steps:
  providing a semiconductor body carrier, which comprises, on a first main area a multiplicity of semiconductor bodies each provided with a contact structure and having an active layer suitable for generating electromagnetic radiation, in a semiconductor layer sequence, and
  forming a planar filling structure on the first main area, wherein the planar filling structure at least partly covers regions of the contact structure and the semiconductor body carrier, without covering the semiconductor body.

I have specified a production concept for optoelectronic components in which the construction of individual optoelectronic components or of a plurality of optoelectronic components combined to form a module is effected at the wafer level. This means that the optoelectronic semiconductor bodies arranged on a semiconductor body carrier are provided with a housing by means of a filling structure.

For this purpose, it is possible to form a chip encapsulation, for example, which consists of a heterogeneous plastic having ceramic-like properties, such as epoxy-silicon mixtures, for example. However, it is also conceivable to use a potting compound consisting of a plastic-solid powder mixture. What is characteristic of the production concept is that the filling structure forms a planar layer.

This facilitates subsequent process steps, such as, for example, electrically connecting the semiconductor bodies, applying a converter or forming optical elements, such as, for example, lenses. These process steps can all be carried out at the wafer level, such that the time-consuming individual processing steps mentioned in the introduction can for the most part be obviated.

The step of forming the planar filling structure may be performed by forming a patterned resist layer that covers at least the semiconductor body, forming the planar filling structure outside the patterned resist layer, and subsequently removing the patterned resist layer.

Accordingly, the filling structure serving as a housing is formed by a lithographic production method, which allows the lithographic precision customary in the production of semiconductor bodies also to be extended to the production of housing encapsulations.

The semiconductor body may be produced as a luminescence diode chip, preferably as a thin-film luminescence diode chip.

The production of a thin-film luminescence diode chip first involves bearing a functional semiconductor layer sequence, which comprises in particular a radiation-emitting active layer, epitaxially on a growth substrate, subsequently applying a new carrier to that surface of the semiconductor layer sequence which lies opposite the growth substrate, and then separating the growth substrate. Since particularly the growth substrates used for nitride compound semiconductors, for example, SiC, sapphire or GaN, are comparatively expensive, this method affords the advantage, in particular, that the growth substrate can be reused. A growth substrate composed of sapphire can be detached from a semiconductor layer sequence composed of a nitride compound semiconductor by a lift-off method, for example.

In particular, the luminescence diode chip can have an epitaxial layer sequence based on a III-V compound semiconductor material, preferably nitride compound semiconductor, but also phosphide compound semiconductor materials or arsenide compound semiconductor materials.

"Based on nitride compound semiconductors" means that the active epitaxial layer sequence or at least one layer thereof comprises a nitride III/V compound semiconductor material, preferably $Al_xGa_yIn_{1-x-y}N$, where $0 \leq x \leq 1$, $0 \leq y \leq 1$ and $x+y \leq 1$. In this case, this material need not necessarily have a mathematically exact composition according to the above formula. Rather, it can comprise one or a plurality of dopants and additional constituents which substantially do not change the characteristic physical properties of the $Al_xGa_yIn_{1-x-y}N$, material. For the sake of simplicity, however, the above formula only includes the essential constituents of the crystal lattice (Al, Ga, In, N), even if these can be replaced in part by small amounts of further substances.

"Based on phosphide compound semiconductors" means that the active region, in particular the semiconductor body, preferably comprises or consists of $Al_nGa_mIn_{1-n-m}P$, where $0 \leq n \leq 1$, $0 \leq m \leq 1$ and $n+m \leq 1$ preferably where $n \neq 0$, $n \neq 1$, $m \neq 0$ and/or $m \neq 1$. In this case, this material need not necessarily have a mathematically exact composition according to the above formula. Rather, it can comprise one or a plurality of dopants and additional constituents which substantially do not change the physical properties of the material. For the sake of simplicity, however, the above formula only includes the essential constituents of the crystal lattice (Al, Ga, In, P), even if these can be replaced in part by small amounts of further substances.

"Based on arsenide compound semiconductors" means that the active region, in particular the semiconductor body, preferably comprises or consists of $Al_nGa_mIn_{1-n-m}As$, where $0 \leq n \leq 1$, $0 \leq m \leq 1$ and $n+m \leq 1$ preferably where $n \neq 0$, $n \neq 1$, $m \neq 0$ and/or $m \neq 1$. In this case, this material need not necessarily have a mathematically exact composition according to the above formula. Rather, it can comprise one or a plurality of dopants and additional constituents which substantially do not change the physical properties of the material. For the sake of simplicity, however, the above formula only includes the essential constituents of the crystal lattice (Al, Ga, In, As), even if these can be replaced in part by small amounts of further substances.

The step of providing a semiconductor body carrier may comprise transferring the multiplicity of semiconductor bodies applied on a semiconductor body carrier from a wafer assemblage individually to the semiconductor body carrier.

Accordingly, the semiconductor body carrier with the multiplicity of semiconductor bodies can take up optoelectronic chip segments from different wafers and combine them to form a new assemblage. This is advantageous, in particular, to compensate for variations in the emission behavior of different semiconductor bodies, losses of yield or the like. It is thus possible,. for example, to test the multiplicity of the semiconductor bodies beforehand, for example, by a wafer tester such that the emission characteristic of the optoelectronic component fulfils certain specifications.

A further possibility consists, then, in arranging semiconductor bodies from different semiconductor wafers on the semiconductor body carrier, such that modules having different color impressions or RGB modules can be produced. By way of example, the pick-and-place technologies known in the art can be used for this purpose.

The step of providing the semiconductor body carrier may comprise transferring the multiplicity of semiconductor bodies applied on the semiconductor body carrier from a wafer assemblage jointly to the semiconductor body carrier by an auxiliary carrier.

For this purpose it is possible to provide a film, for example, which accepts semiconductor bodies produced on a wafer and places them on the semiconductor body carrier.

My methods are explained in greater detail below on the basis of a plurality of examples with reference to the figures.

Elements, regions and structures that are functionally identical or identical in terms of their effect bear identical reference symbols. In so far as elements, regions or structures correspond in terms of their function, the description thereof is not necessarily repeated in each of the figures.

Referring now to the drawings generally and FIG. 1A in particular, the starting point of the method is described below. FIG. 1A shows a semiconductor body carrier 10, on which a multiplicity of semiconductor bodies 14 are applied on a first main area 12.

The semiconductor bodies 14 each have a contact structure 20 suitable for making electrical contact with the semiconductor body 14. The semiconductor body 14, which is arranged above the contact structure 20, comprises an active layer 16 embedded in a semiconductor layer sequence 15. The active layer 16 is preferably designed for generating radiation. Preferably, the respective semiconductor body is embodied as a luminescence diode semiconductor body.

Furthermore, the semiconductor body 14 comprises a semiconductor layer sequence 15. The semiconductor layer sequence 15 can have two semiconductor layers, for example, between which the active layer 16 is arranged. In this case, the semiconductor layers are preferably of different conduction types, in particular doped for different conduction types (n-conducting or p-conducting). The semiconductor body 14 is furthermore preferably grown epitaxially.

A semiconductor layer structure for the semiconductor bodies 14 can be deposited on a growth substrate epitaxially, for example, by metal organic vapor phase epitaxy. Semiconductor bodies can then be formed from the semiconductor layer structure, for example, by etching.

A radiation exit area 18, the area of which substantially corresponds to the size of the semiconductor structure, is formed on the top side of the semiconductor body 14. In this case, the semiconductor body 14 can be embodied in rectangular fashion, for example, wherein the side length of the rectangle can vary over a large range. Thus, it is possible, on the one hand, to form semiconductor bodies having a side length of less than 50 μm, but is also conceivable to use large-area semiconductor bodies having side lengths of up to 5 mm.

In this case, the semiconductor layer sequence 15 has approximately a thickness of 6 μm, for example, wherein this value can also vary in a large range. The contact structure 20 usually involves metal tracks that are produced, for example, from a sputtered metal layer by means of photolithographic techniques. The thickness thereof is usually a few micrometers.

The example shown in FIG. 1A merely constitutes one variant of a construction of a semiconductor body. Other arrangements are conceivable too, which differ from the example in accordance with FIG. 1A, for example, by virtue of a different type of contact-connection, that is to say formation of the connection carrier 20.

Thus, FIG. 1B shows a semiconductor body 14 having a respective contact on both side areas, these contacts being connected to the contact structure 20. Consequently the contacts are arranged on opposite sides in this example.

However, it is also conceivable to carry out a contact-connection via an edge of the semiconductor body, as shown in FIG. 1C.

For this purpose, the semiconductor body 14 is arranged above the semiconductor body carrier 10 and provided with an insulation material 30 on one side. The connections to the semiconductor layer sequence can then be arranged above and/or below the insulation material 30.

The semiconductor bodies 14 are furthermore preferably arranged in accordance with a regular pattern on the semiconductor body carrier 10, as is shown in FIG. 2. It can be discerned on the basis of the plan view shown in FIG. 2 that the semiconductor bodies 14 are arranged in the form of a matrix, for example.

In this case, the semiconductor bodies 14 can be arranged in a freely selectable grid on the semiconductor body carrier 10. The multiplicity of the semiconductor bodies 14 can originate from a wafer assemblage, for example, wherein the semiconductor bodies 14 are transferred individually to the semiconductor body carrier 10. By way of example, the pick-and-place method known in the art can be used for this purpose.

Accordingly, it is possible for semiconductor bodies 14 of the wafer assemblage to be subjected to a test as early as after production, by way of example, to preselect the semiconductor bodies 14 to be arranged on the semiconductor body carrier 10 with regard to their radiation characteristic. However, it is also conceivable to use semiconductor bodies from different wafer assemblages which, by way of example, have different active layers 16 suitable for generating electromagnetic radiation such that the semiconductor bodies 14 on the semiconductor body carrier 10 can emit electromagnetic radiation having different wavelengths.

It is likewise possible to transfer semiconductor bodies from a wafer assemblage to the semiconductor body by an auxiliary carrier, for example, a film, preferably a thermorelease film. Individual processing steps, in particular, are obviated in this case.

A first example for producing a multiplicity of optoelectronic components is described below with reference to FIGS. 3A to 3B.

In this case, the starting point of the method is the semiconductor bodies 14 arranged on the semiconductor body carrier 10 as described in FIGS. 1A to 1C.

As is shown in FIG. 3A, in a first step, a photoresist layer is applied, which is subsequently patterned. In this case, the patterning of the photoresist layer can be carried out, for example, by means of the photolithographic exposure known in the art. A photoresist structure 40 covering the semiconductor body 14 and also parts of the contact structure 20 is obtained as a result. In this case, the photoresist layer is patterned in such a way that empty regions arise in each case at the sides of the semiconductor bodies 14. In this case, the photoresit layer is also removed between contact structures 20 of adjacent semiconductor bodies.

A multiplicity of materials can be used for the semiconductor body carrier 10. Provision is thus made, for example, for using a ceramic substrate or a silicon substrate. Further possible materials comprise magnesium oxide, aluminum oxide, sapphire, aluminum nitride or other known materials.

Figure 3B:
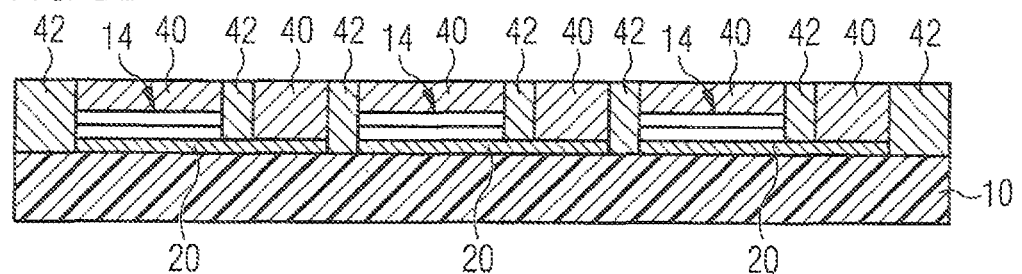

Referring to FIG. 3B, the application of a filling layer is then shown, said filling layer subsequently being planarized. A filling structure embedded into the part freed of the photoresist is obtained as a result. By virtue of the planarization step, the filling structure 42 has a height substantially identical to that of the resist structure 40. In this case, the filling material can be plastic, for example. Benzocyclobutene is preferably used.

Figure 3C:
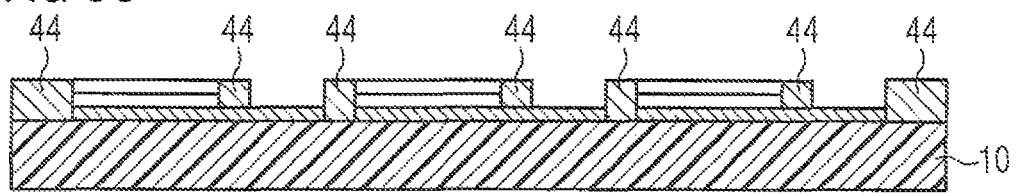

In the next step, shown in FIG. 3C, the resist structure 40 is removed and a further planarization step is carried out. The further planarization step reduces the height of the filling structure 42, such that a filling structure 44 which is planar with the top side of the semiconductor bodies 14 is now formed.

Accordingly, it is then possible to perform all further process steps on a planar system in a wafer level assemblage. The further process steps comprise forming protective diodes, applying a converter, forming reflector layers or applying optical elements, such as, for example, lenses. It should be mentioned, however, that these further process steps need not necessarily all be performed. It is thus conceivable, for example, to produce optoelectronic components which do not require a converter or are operated without protective diodes. Consequently, the process steps shown below should be understood merely by way of example.

Figure 3D:
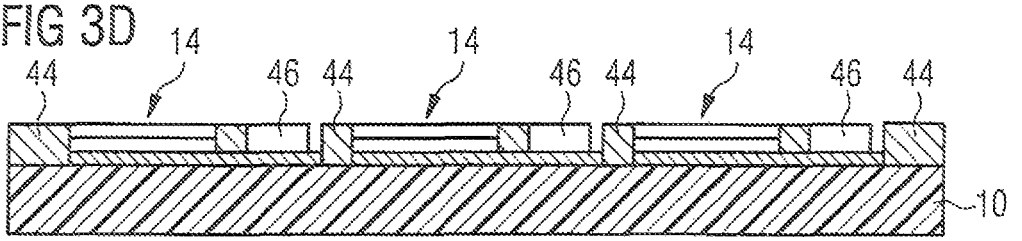

FIG. 3D then shows the formation of protective diodes 46, which are arranged on the connection carrier 20 on the corresponding first contact areas 21 and second contact areas 22, respectively. Furthermore, the electrical wiring is also carried out in this process step.

Figure 3E:
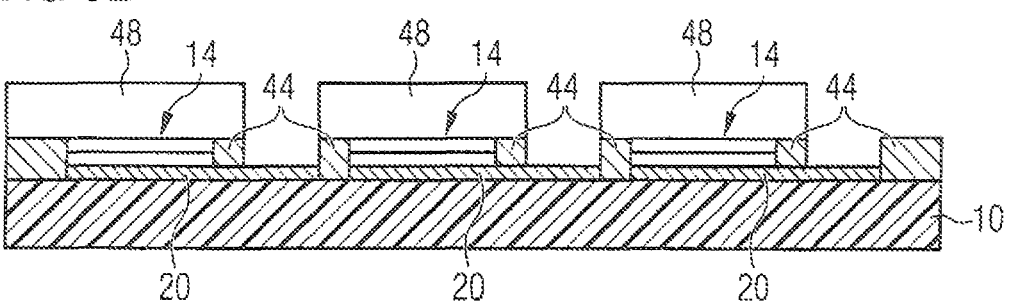

Referring to FIG. 3E, the formation of a converter above the emission area of the semiconductor body 14 is then shown. The converter layer is a silicone layer, for example, into which at least one luminescence conversion substance is embedded. The at least one luminescence conversion substance can be, for example, YAG:Ce or a known luminescence conversion substance.

By the luminescence conversion substance, by way of example, the wavelength of at least part of the radiation emitted from the active layer 12, the radiation being green, blue or ultraviolet light, for example, is converted into a complementary spectral range in such a way that white light arises.

The use of a silicone layer as carrier layer for the luminescence conversion substance has the advantage that silicone is comparatively insensitive to short-wave blue or ultraviolet radiation. This is advantageous, in particular, for luminescence diode chips which are based on nitride compound semiconductors and in which the emitted radiation generally contains at least one component from the short-wave blue or ultraviolet spectral range. Alternatively, some other transparent organic or inorganic material can also function as carrier layer for the at least one luminescence conversion substance.

Further process steps comprise applying a contact layer as reflective contact layer. Furthermore, a barrier layer can be arranged between a contact layer 20 and a connecting layer. The barrier layer contains Ti WN, for example. The barrier layer prevents, in particular, diffusion of material of the connecting layer, which is a solder layer, for example, into the reflective contact layer, which could adversely affect, in particular, the reflection of the reflective contact layer. However, these steps are known to the person skilled in the art and will therefore not be described in great detail.

The converter can be provided on a carrier film, for example, and be transferred in one step to in each case one semiconductor body of the multiplicity of optoelectronic components. Consequently, time-consuming individual processing steps on individual optoelectronic components are obviated. For the converter material of the converter 48, various production methods are known in the art.

Referring to FIGS. 4A to 4E, a second example of the method for producing a multiplicity of optoelectronic components is described below.

The method in accordance with FIGS. 4A to 4E differs from the method described above in that the step of further planarization of the filling structure is omitted. Consequently, the resist structure projects beyond the radiation exit area of the semiconductor body, such that a cavity arises above the latter.

Figure 4A:
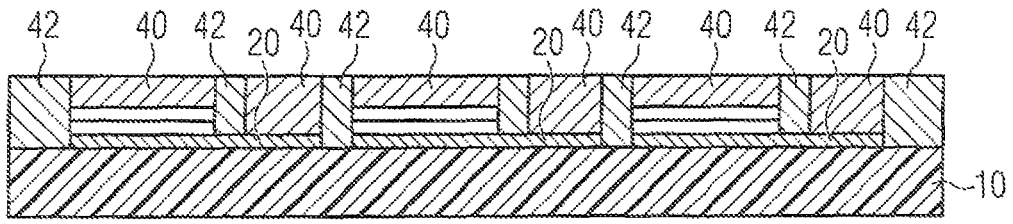
FIGS. 4A to 4E show a further example for producing a multiplicity of optoelectronic components in a schematic cross-sectional view.
Figure 4B:
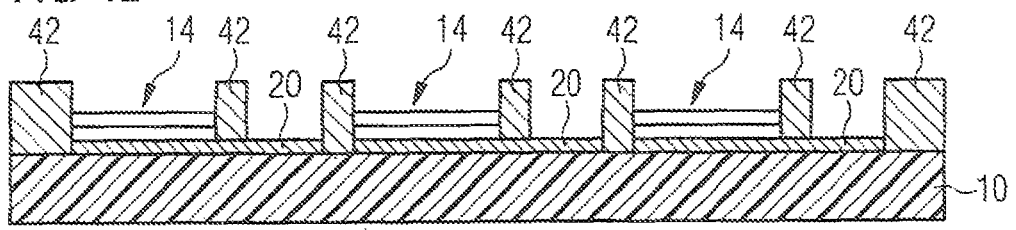
Figure 4C:
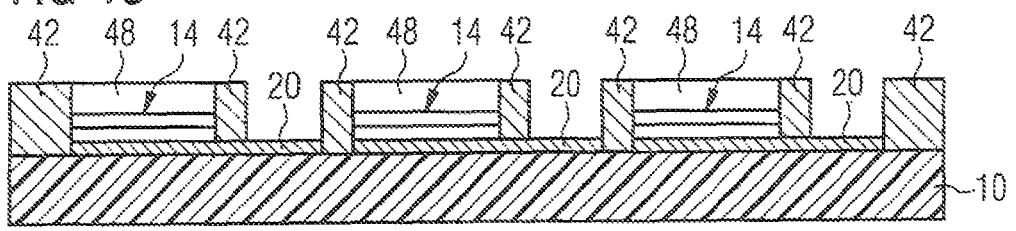

The cavity can subsequently be utilized, as is shown in FIG. 4C, for being filled with the converter 48. A converter material which is present in a liquid state of matter and cures after filling the cavities is advantageously used for this purpose. Furthermore, provision is likewise made for leaving a gap between the radiation exit area and the converter, or providing a covering. This has, in particular, thermal advantages when optoelectronic components which emit radiation in the ultraviolet range are used.

Figure 4D:
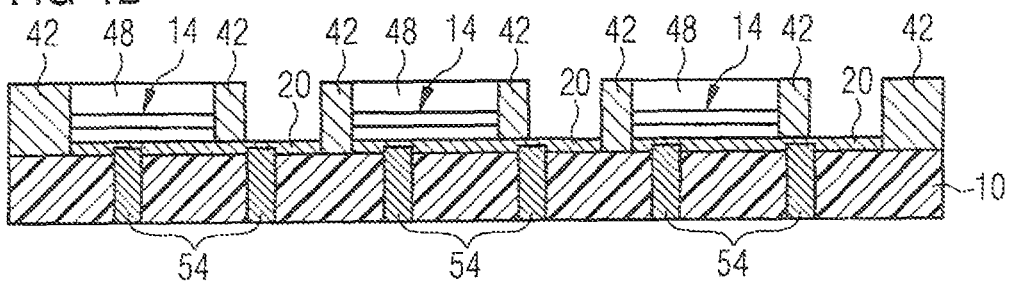

A further variant concerns FIG. 4D, which shows that contact is made with the contact areas 21, 22 of the contact structure 20 from the side opposite to the first main area 12 by means of plated-through holes 54 (so-called vias). Accordingly, it is possible to produce optoelectronic components which are suitable for surface mounting.

A further variant (not shown in FIG. 3 or 4) concerns the formation of protective diodes. Particularly when a silicon substrate is used as semiconductor body carrier 10, a protective diode can be formed directly in the semiconductor body 10 by means of suitable doping, for example. By corresponding dimensioning, that is to say adaptation of the size of the doped regions, the electrical characteristic of the protective diode can be adapted to the respective application.

This variant saves, in particular the cost-intensive equipping with external protective diodes, as was shown in FIG. 3D.

Figure 4E:
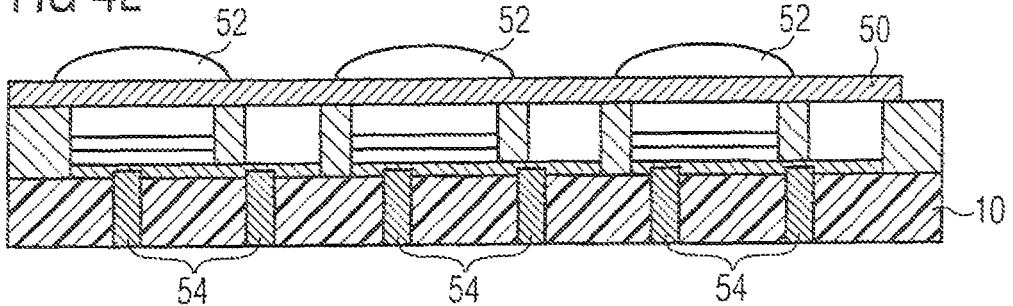

Referring to FIG. 4E, the latter shows that an optical unit is applied above the optoelectronic components. In this case, the optical unit can consist of a multiplicity of lenses 52 arranged on a carrier 50. Accordingly, a lens 52 is then formed for each of the optoelectronic semiconductor bodies on the semiconductor body carrier 10 in a single process step.

A further example is described below with reference to FIGS. 5A and 5B. in this case, the process steps shown follow the method steps in accordance with FIGS. 3A to 3E or FIGS. 4A to 4E.

Figure 5A:
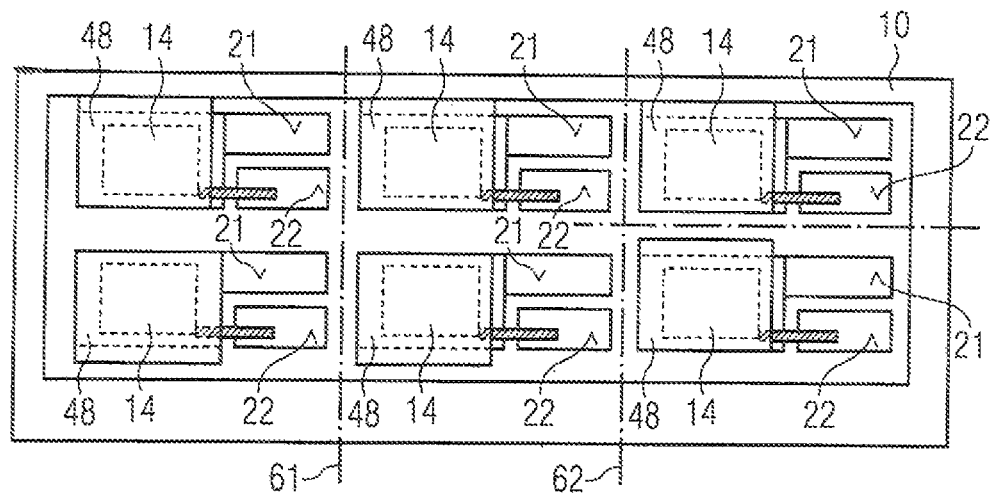
FIG. 5A shows a further example of optoelectronic components in a plan view.

As is shown in FIG. 5A, it is then possible to singulate the multiplicity of optoelectronic components that are arranged in a regular pattern on the semiconductor body carrier 10.

In this case, the semiconductor body 10 is cut apart both horizontally and vertically with respect to the plane of the drawing in FIG. 5A. As is shown in FIG. 5A, by way of example, modules containing one or two luminescence diode chips can be formed in this case.

Figure 5B:
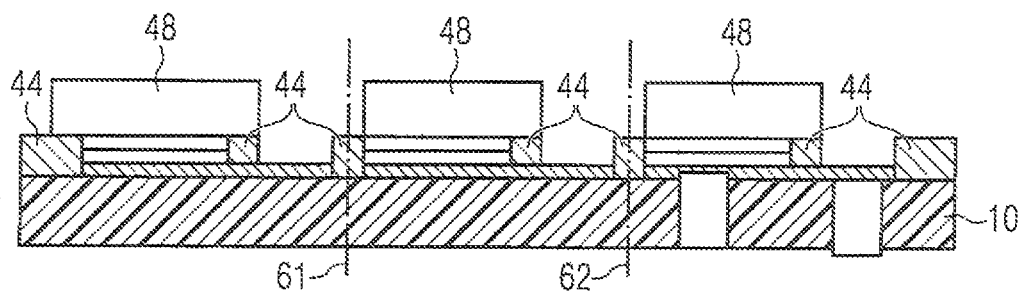
FIG. 5B shows a schematic cross-sectional view of optoelectronic components in accordance with FIG. 5A.

For this purpose, by way of example, cuts are made through the filling material between adjacent semiconductor bodies 14, as is depicted schematically in FIG. 5B on the basis of the cutting lines 61 and 62.

Figure 6:
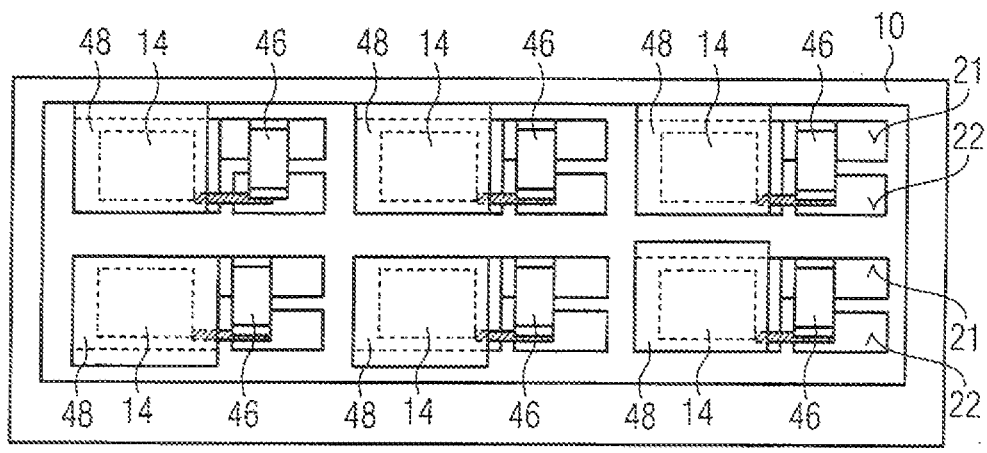
FIG. 6 shows a further example of optoelectronic components in a plan view.

Equipping with protective diodes 46 is explained in greater detail in a further example in FIG. 6. The protective diodes 46 are arranged on the first contact areas 21 and the second contact areas 22 by means of a surface mounting method, for example. In this case, the fitting of the protective diodes 46 is advantageously carried out before the optoelectronic components are singulated.

A further variant is described below with reference to FIGS. 7A and 7B.

This variant concerns the application of the filling material, which consists of a potting compound in accordance with this example. For this purpose, the semiconductor body carrier 10 is provided with the potting compound 70. The latter can be applied in drop form, for example.

The semiconductor body carrier 10 is introduced between two workpieces 72 and 74, wherein the two workpieces are heated. In this case, the upper workpiece 74 has an opening (cavity) in order not to touch the semiconductor bodies 14 on the semiconductor body carrier 10. The potting compound 70 is then pressed between the semiconductor bodies 14 by pressing. After a planarization step, the further process implementation follows according to the description of FIGS. 3B and 4B respectively.

Figure 8:
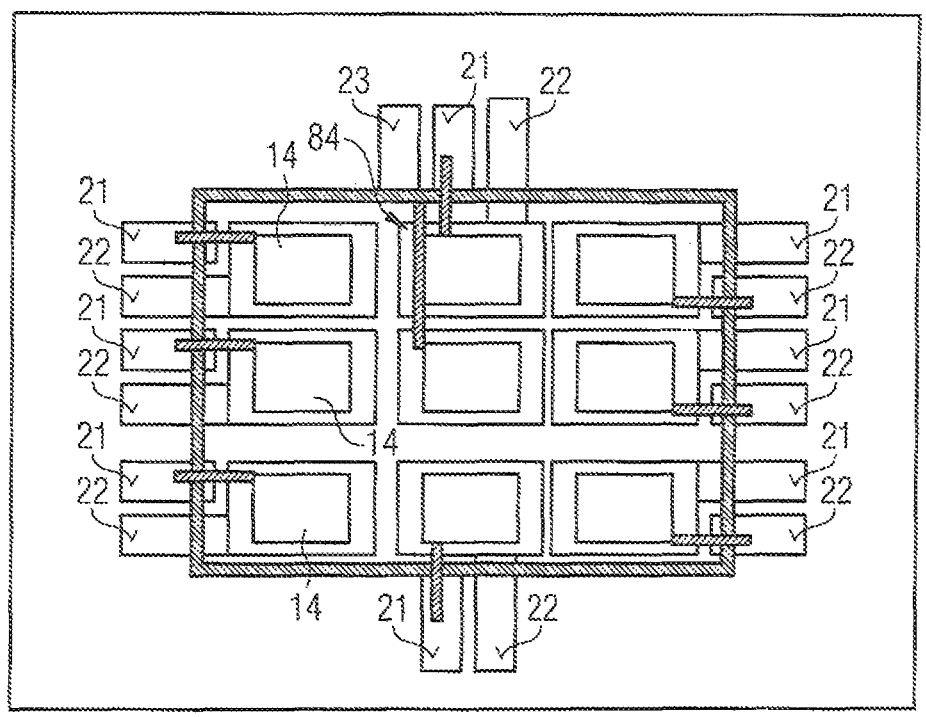
FIG. 8 shows a further example of a multiplicity of optoelectronic components in a plan view.

FIG. 8 shows a further example in which the multiplicity of optoelectronic components are applied on a common connection carrier.

As can be seen in FIG. 8, in this case the outer semiconductor bodies 14 are respectively provided with connection areas 21 and 22. The semiconductor body lying in the inner portion of the arrangement is led to a contact zone 23 by means of a bridge contact 84 running over the conductor track of the chip arranged thereabove.

In accordance with this example, it is possible to provide modules of any desired size which consist of a multiplicity of optoelectronic components. As has been described above, it is now possible to form optoelectronic components without having to carry out a multiplicity of individual processing steps.

This will be explained in summary again with reference to FIG. 9, which shows a semiconductor body carrier 10 comprising a multiplicity of optoelectronic components. The semiconductor body carrier 10 can be a 6" wafer, for example. A multiplicity of lenses produced in the wafer assemblage are shown on the left-hand side. Consequently, it is possible to carry out, for example, the fitting of optical elements above the semiconductor body 14 in an individual step for a multiplicity of optoelectronic components on a semiconductor body carrier.

A further example is shown with reference to FIG. 10. In accordance with this example, a so-called "stacked" semiconductor body is used, consisting of three semiconductor layer sequences, for example, which are each provided with different active layers to form, for example, red, green or blue emitting semiconductor bodies.

The latter are arranged one above another, wherein a mirror layer, a diffusion barrier and a soldering layer can be arranged underneath. By way of example, a passivation layer can be arranged on the sidewalls of this layer stack.

Furthermore, provision is likewise made for forming a mirror 90 on the sidewalls of the filling material. In this case, the sidewall angle of the sidewalls of the filling material can be variable. To form passivation layers 92 and the mirrors arranged on the sidewalls, it is possible to use a process implementation that proceeds similarly to that in FIGS. 3A to 3E and 4A to 4E, respectively.

This process implementation differs, however, in that the patterning of the resist layer as shown in FIG. 3A, for example, is carried out in such a way that the resist layer also covers the sidewalls of the semiconductor bodies 14. Consequently, a gap arises after the removal of the resist structure between the semiconductor body 14 and the filling structure, into which gap the passivation and the mirrors can respectively be introduced.

This disclosure is not restricted to examples. Rather, the disclosure encompasses any novel feature and also any combination of features, which in particular includes any combination of features in the appended claims, even if the feature or this combination itself is not explicitly specified in the claims or examples.

The invention claimed is:

1. A method for producing a multiplicity of optoelectronic components comprising:
   providing a semiconductor body carrier comprising on a first main area a multiplicity of semiconductor bodies, each provided with a contact structure and having an active layer that generates electromagnetic radiation, in a semiconductor layer sequence, wherein providing the semiconductor body carrier comprises transferring the multiplicity of the semiconductor bodies from at least one wafer assembly individually or jointly to the semiconductor body carrier, and
   forming a planar tilling structure on the first main area such that the planar filling structure at least partly covers regions of the contact structure and the semiconductor body carrier without covering the semiconductor body, by forming a patterned resist layer that covers at least the semiconductor body, forming the planar filling structure outside the patterned resist layer, and removing the patterned resist layer.

2. The method as claimed in claim 1,
   wherein providing the semiconductor body carrier comprises transferring the multiplicity of the semiconductor bodies from a wafer assemblage individually to the semiconductor body carrier.

3. The method as claimed in claim 2,
   wherein the multiplicity of the semiconductor bodies are arranged in a freely selectable grid on the semiconductor body carrier.

4. The method as claimed in claim 1,
   wherein providing the semiconductor body carrier comprises transferring the multiplicity of the semiconductor bodies from a plurality of wafer assemblages individually to the semiconductor body carrier, Wherein semiconductor bodies of different wafer assemblages comprise different active layers that generates electromagnetic radiation.

5. The method as claimed in claim 4,
   wherein the multiplicity of the semiconductor bodies are arranged in a freely selectable grid on the semiconductor body carrier.

6. The method as claimed in claim 1,
   wherein the multiplicity of semiconductor bodies are transferred by an auxiliary carrier.

7. The method as claimed in claim 1,
   wherein a converter is arranged on the first main area, an intermediate layer is arranged between the converter and a side of the semiconductor body opposite to the first main area.

8. The method as claimed in claim 7,
   wherein a lens is applied on the converter.

9. The method as claimed in claim 1,
   wherein the semiconductor body carrier comprises a semiconducting material in which a protective diode is formed, said protective diode being connected to connection areas of the contact structure.

10. The method as claimed in claim 1,
    wherein a protective diode is arranged on the semiconductor body carrier, the protective diode being connected to connection areas of the contact structure.

11. The method as claimed in claim 1,
    wherein the semiconductor body carrier has connection areas connected to a side of the semiconductor body carrier opposite to the first main area via plated-through holes to enable surface mounting of the optoelectronic component.

12. The method as claimed in claim 1,
    wherein one or a plurality of optoelectronic components is/are singulated by separation of the semiconductor body carrier.

13. The method as claimed in claim 1,
    wherein a plurality of optoelectronic components are singulated by separation of the semiconductor body carrier such that an assemblage of a plurality of optoelectronic components is formed, wherein optoelectronic components at an edge of the assemblage contact optoelectronic components in the inner portion of the assemblage by bridge contacts.

14. A method for producing a multiplicity of optoelectronic components comprising:
    providing a semiconductor body carrier comprising on a first main area a multiplicity of semiconductor bodies, each provided with a contact structure and having an active layer that generates electromagnetic radiation, in a semiconductor layer sequence, wherein providing the semiconductor body carrier comprises transferring the multiplicity of the semiconductor bodies from at least one wafer assembly individually or jointly to the semiconductor body carrier, and
    forming a planar filling structure on the first main area such that the planar filling structure at least partly covers regions of the contact structure and the semiconductor body carrier without covering the semiconductor body, wherein the planar filling structure is arranged at a distance from at least one sidewall of the semiconductor bodies to form a mirror layer laterally with respect to the semiconductor bodies.

15. A method for producing a multiplicity of optoelectronic components comprising:
    providing a semiconductor body carrier comprising on a first main area a multiplicity of semiconductor bodies, each provided with a contact structure and having an active layer that generates electromagnetic radiation, in a semiconductor layer sequence, wherein providing the semiconductor body carrier comprises transferring the multiplicity of the semiconductor bodies from at least one wafer assembly individually or jointly to the semiconductor body carrier, and
    forming a planar filling structure comprising benzocyclobutene on the first main area such that the planar filling structure at least partly covers regions of the contact structure and the semiconductor body carrier without covering the semiconductor body wherein the planar filling structure is arranged at a distance from at least one sidewall of the semiconductor bodies to form a mirror layer laterally with respect to the semiconductor bodies.

* * * * *